(12) United States Patent
Yorio et al.

(10) Patent No.: US 6,307,304 B1
(45) Date of Patent: Oct. 23, 2001

(54) SWITCH SYSTEM

(75) Inventors: Rudy Yorio; Andrzej T. Guzik, both of Pompano Beach; William Boone Mullen, III, Coral Springs; Danny E. Ross, Plantation; Raymond C. Vivian, Jr., Clearwater, all of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/548,845

(22) Filed: Apr. 13, 2000

(51) Int. Cl.⁷ .................................................. H01L 41/113
(52) U.S. Cl. .............................................................. 310/339
(58) Field of Search .............................................. 310/339

(56) References Cited

U.S. PATENT DOCUMENTS

| | | | |
|---|---|---|---|
| 3,297,889 | * 1/1967 | Breskend | 310/339 |
| 3,797,010 | * 3/1974 | Adler et al. | 340/323 |
| 4,156,825 | * 5/1979 | Kondo et al. | 310/339 |
| 4,379,245 | * 4/1983 | Goldstein | 310/319 |
| 4,691,117 | * 9/1987 | Greenwood et al. | 310/339 |
| 4,853,580 | * 8/1989 | Sula | 310/339 |
| 5,034,648 | * 7/1991 | Gastgeb | 310/330 |
| 5,512,795 | * 4/1996 | Epstein et al. | 310/330 |
| 5,977,690 | * 11/1999 | Ellis et al. | 310/330 |
| 6,060,817 | * 5/2000 | Mullet et al. | 310/339 |

* cited by examiner

Primary Examiner—Thomas M. Dougherty
(74) Attorney, Agent, or Firm—Randi L. Dulaney

(57) ABSTRACT

A piezoelectric active-mode incrementor switch system (100) includes two ratchet wheels (118, 124) that are rotationally mounted on a drive shaft (112) having a knob (102). The ratchet wheels (118, 128) form a slipping clutch with their respective drive wheels (116, 128) which are rigidly mounted to the drive shaft and mechanically loaded with spring (120). The ratchet wheels (118, 124) are mounted inversely to each other on the drive shaft (112) and make contact with their respective cantilever beams (114, 136) which each have a piezoelectric film. In operation, the switch (100) functions by mechanically stimulating the piezoelectric beams. When the knob (102) is rotated in one direction, only one of the beams (114, 136) is displaced causing a generation of an electrical charge that acts as a signal. The other beam (114 or 136) is prevented from moving and therefore its beam does not produce a signal. When the knob (102) is rotated in the opposite direction, the other beam that was previously prevented from moving is displaced causing an electrical signal to be generated by the switch.

12 Claims, 6 Drawing Sheets

SWITCH SYSTEM

TECHNICAL FIELD

This invention relates in general to electrical devices, and more particularly to a piezoelectric active-mode incrementor switch system.

BACKGROUND

Electronic devices such as instruments, stereos, portable two-way radios, etc. are usually equipped with a variety of rotary switches to control device operation. Presently, most of these switches are of the electro-mechanical type. Unfortunately, electromechanical switches have limited reliability due to the wear of the switch contacts or contamination of the contacts. Some electro-mechanical switches are also complex and expensive to manufacture. A need thus exists for a switch system that can minimize some of the problems previously mentioned.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
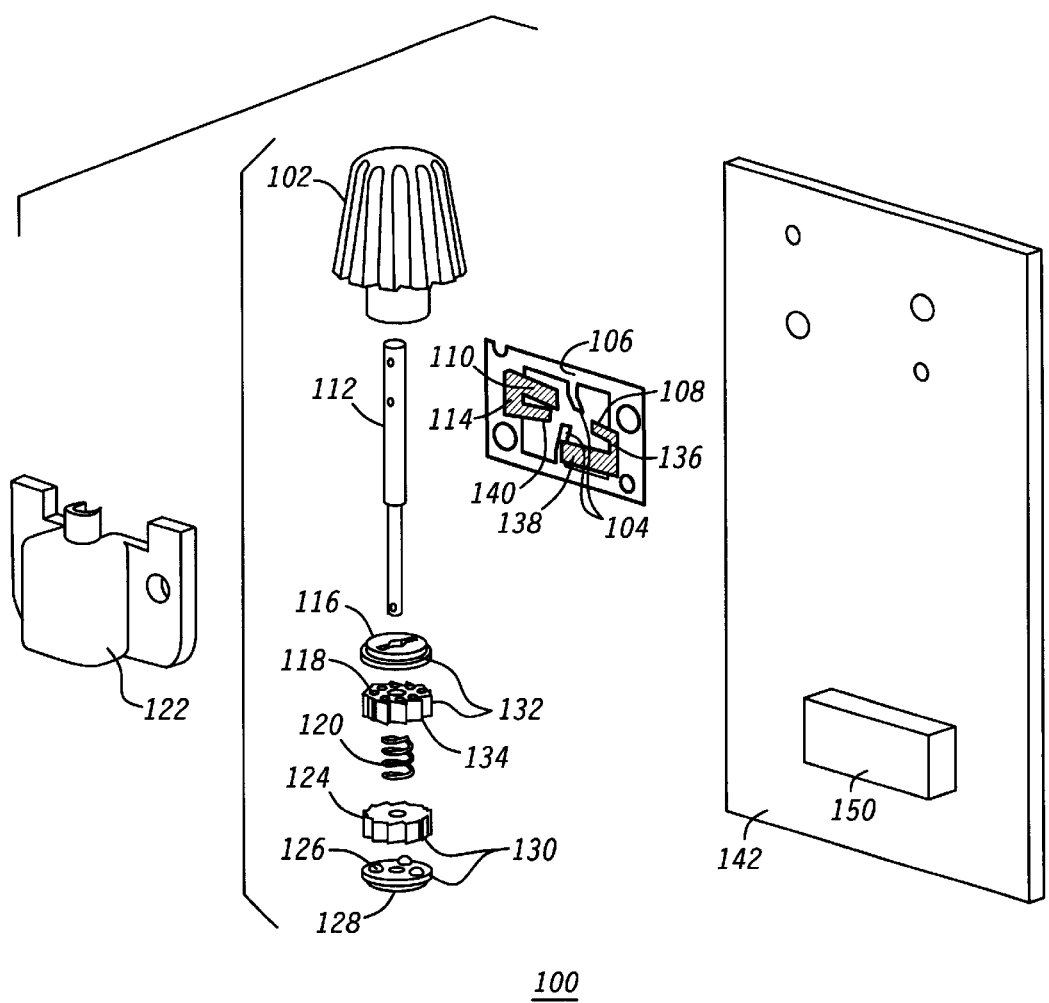
FIG. 1 shows an exploded view of a piezoelectric active-mode incrementor switch system in accordance with the preferred embodiment of the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is shown a piezoelectric active-mode incrementor switch system 100 in accordance with the present invention. The piezoelectric active-mode incrementor switch system 100 comprises two clutches 130, 132, a drive shaft 112, spring 120, piezo beam assembly 106, switch housing 122, switch knob 102, and switch mounting board 142. Clutches 130 and 132 are mounted on the drive shaft 112, and each clutch includes a drive wheel 116 or 128 and spring loaded ratchet wheels 134 or 124. The drive wheels 116, 128 are coupled to their corresponding ratchet wheels 134, 124 via matching protrusions 126 found in each of the drive wheels 116, 128 which mate to cavities 118 found in each of the ratchet wheels 134, 124. The matching protrusions 126 and cavities 118 along with coil spring 120 create a slipping clutch mechanism.

The drive wheels 116, 128 are fixed to the drive shaft 112 preferably using a spline or key (e.g., "D shaped" aperture) on the center of the drive wheels 116, 128 in order to prevent rotational slippage. The ratchet wheels 134, 124 are rotationally (loosely) mounted on the drive shaft 112 using substantially round apertures at the center of each of the ratchet wheels. The round apertures at the center of the ratchet wheels 134, 124 allow them to rotate about the drive shaft 112. The ratchet wheels 134, 124 are capable of rotating around the drive shaft using the slip clutch formed by the protrusions 126 and cavities 118 along with the mechanical loading provided by spring 120.

The piezoelectric beam (also referred as the "piezo beam") assembly 106 is preferably formed from a one-piece sheet metal part having a piezoelectric film laminated to one side. The piezo beam assembly 106 is formed in such a way that two individual cantilever beams 110, 138 are spring loaded against the ratchet wheels 124, 134 to cause a downward force or mechanical pre-load on the ratchet wheels 124, 134. The downward force on the ratchet wheels 124, 134 causes a much higher voltage output to be generated from the small piezoelectric beams 110, 138 that is much higher than when the piezoelectric beams 110, 138 are in a relaxed position. It also allows the piezoelectric active-mode incrementor switch system 100 to be less sensitive to inadvertent mechanical shock, such as a bump or drop, which might cause a false electrical pulse to be generated by beams 110 or 138 than if they were freely suspended.

The piezoelectric film is divided into two sections 114, 136 by a polarization process. These two sections are metallized to provide electrodes for accumulating the electrical charge during mechanical excitation of each piezoelectric beam 110, 138. The metallization extends to finger contacts 108, 140 that provide an electrical interconnection between each cantilever beam 110, 138 and a switch controller circuitry 150 located on printed circuit board 142. The electrical interconnection between control circuit 150 and piezoelectric beam assembly 106 can be accomplished by the finger contacts 108, 140 electrically interconnecting with electrical traces found on circuit board 142. A pair of ground contact fingers 104 provides a common ground connection with the printed circuit board 142.

In operation, the piezoelectric active-mode incrementor switch system 100 functions by mechanically stimulating the piezoelectric beams 110, 138, which in turn produce electrical signals. If the shaft 112 begins a clockwise rotation, the top or first drive wheel 116 moves together with the top or first ratchet wheel 134. The bottom or second ratchet wheel 124 is blocked by the cantilever beam 138 since the teeth on ratchet wheel 124 face the opposite direction to those on ratchet wheel 134. Due to the clockwise rotation and the slipping clutch design, the second ratchet wheel 124 is disconnected from its mating or second drive wheel 128. The slipping clutch is designed such that the steps caused by the ratchet wheels are not too severe to cause a false pulse on the unactuated beam (piezoelectric beam).

By rotating the knob in a counterclockwise direction, the bottom or second ratchet wheel 124 moves together with bottom or second drive wheel 128, while the front ratchet wheel 134 is blocked by cantilever beam 110 and is disconnected from its drive wheel 116 by the slip clutch design. With a counterclockwise rotation, the second piezoelectric beam 138 is subjected to dynamic excitation, and generates a positive charge (signal) that is transmitted through the finger contact 108 to the control circuit 150. In one particular design, each step in a clockwise rotation of knob 102 can increment the stored value in control circuit 150, while a counterclockwise rotation of knob 102 can decrement the stored value in control circuit 150 for the switch. The mechanical movement of the piezoelectric beams causes a change of state in the beams and causes an electrical signal to be generated by the piezoelectric film.

Since the piezoelectric film found on beams 110, 138 generates the voltage spikes that are stored in the switch position memory found in control circuit 150, the switch will remember its position even if the radio is turned off and the battery is removed when a nonvolatile memory is used. A nonvolatile memory suitable for such use is an electrically erasable programmable read-only memory (also referred to as an "EEPROM"). When such a nonvolatile memory is used, the electrical position of the switch will correlate to the knob's legend.

Figure 4:
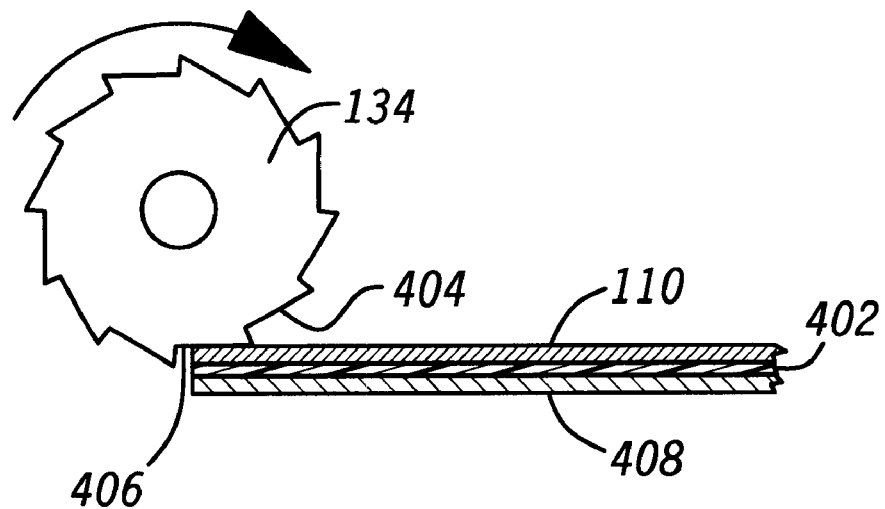
FIG. 4 illustrates how a ratchet wheel on the "piezoelectric active-mode incrementor switch system of FIG. 1 activates the piezoelectric member.

Referring now to FIG. 4, a close-up view of ratchet wheel 134 and piezoelectric beam 110 is shown in order to get a better understanding on how the beam is deflected. When the ratchet wheel 134 rotates from position 406 to position 404, the tip of the first cantilever beam 110 is suddenly displaced from one tooth on ratchet wheel 134 to the next one. This displacement causes a dynamic excitation of the piezoelectric beam 110 that generates a positive electrical charge in the polarized piezoelectric film 402. Further clockwise rotation of ratchet wheel 134 cause further electrical charges to be generated and recorded by the switch control circuit 150 (shown in FIG. 1). The piezoelectric film 402 is attached to cantilever beam 110 that is part of the piezo beam assembly shown in FIG. 1. The piezoelectric film 402 is metallized at 408 to provide electrodes for accumulating electrical charges during the mechanical excitation of the beam 110. The metallization 408 extends to the finger contact 140, shown in FIG. 1, which provides electrical interconnection from the cantilevered beam to the controller board 150 (shown in FIG. 1).

Figure 2:
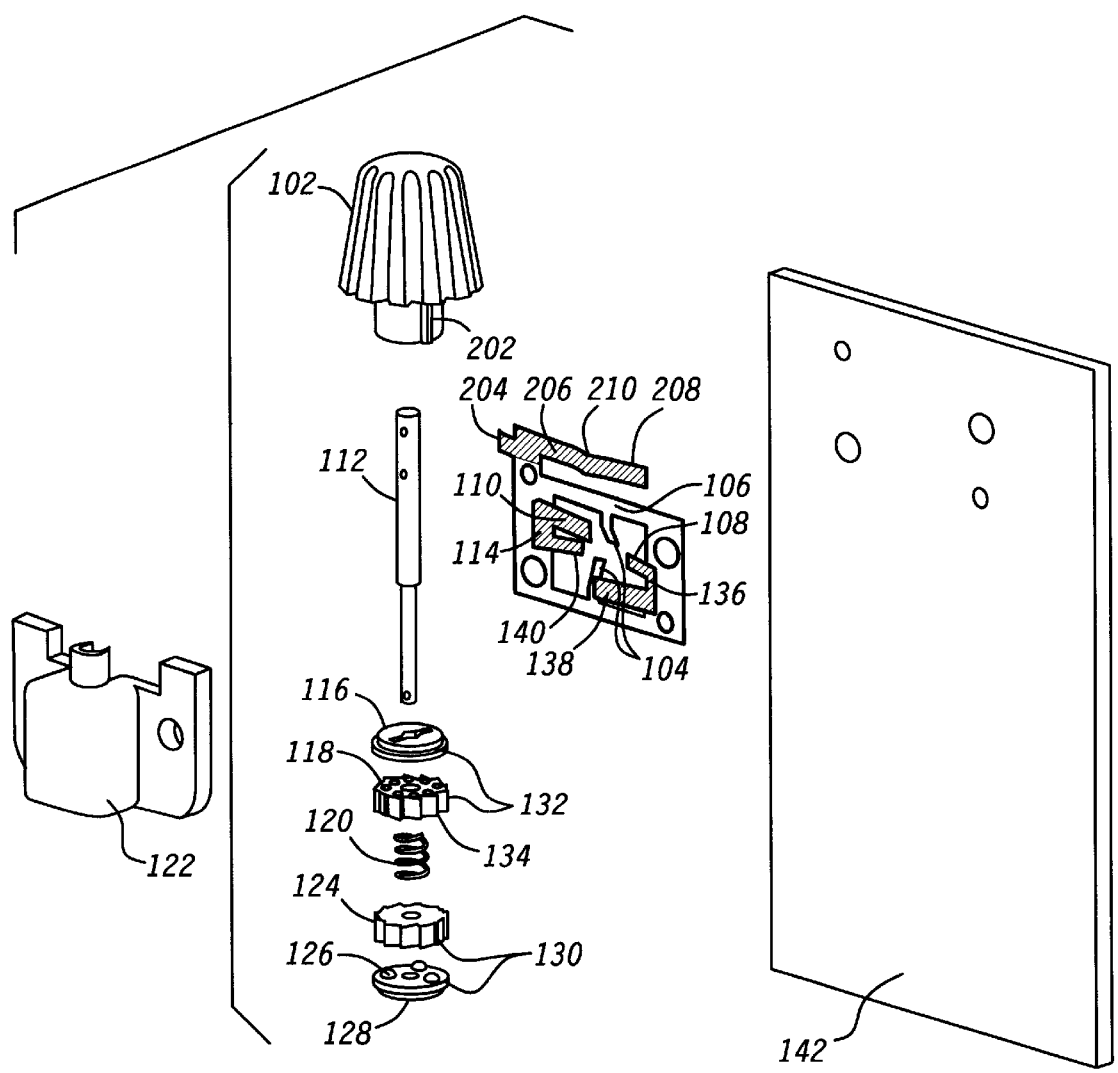
FIG. 2 shows an exploded view of a piezoelectric active-mode incrementor switch system in accordance with a first alternative embodiment of the present invention.

Referring now to FIG. 2, there is shown an exploded view of a first alternative embodiment of the present invention. Piezoelectric active-mode incrementor switch system 200 is very similar to switch 100 but further includes a reset switch. This embodiment includes an extra piezoelectric beam 208 and cam 202, as compared to the previously described switch 100. In this embodiment, the piezoelectric film is divided into three sections 114, 136 and 206 by the polarization process. These three sections are metallized to provide electrodes for accumulating the electrical charge during mechanical excitation of each of the beams 110, 138 and 208. The metallization extends to the finger contacts 108, 110 and 204 that provide electrical interconnection between each cantilever beam and the controller circuitry (not shown) located on printed circuit board ("PCB") 142. Fingers 104 provide a common ground connection as was the case in switch 100.

Piezoelectric beam 208 generates a positive electrical charge at the beginning, or at the end of a complete knob rotation. At the beginning of the knob's clockwise rotation, the piezo beams 110 and 208 are simultaneously actuated, respectively by the ratchet wheel 134, and the cam 202 located on knob 102. Mechanical excitation of the two beams 110 and 208 generates two charges which are transmitted to a microprocessor or other control device or circuit known to those of ordinary skill in the art (not shown) and read as a command to reset the switch position to for example, channel number one, or to a special mode, "ON" or "OFF".

Rotating the knob 102 in a counterclockwise direction from a first switch position to a second switch position, causes the piezo beams 138 and 208 to simultaneously become actuated, respectively by ratchet wheel 124 and the cam 202 found on knob 102. These beam excitations generate two charges which are transmitted to the control circuit and read as a switch special mode ("ON"/"OFF", etc.) or one of the signals may be discarded if only a standard switch function is required. The knob's cam 202 creates a novel and improved design for a rotary selector (rotary switch) with integrated mode switch mechanism. Beam 208 has a slight upward bend 210 that contacts cam 202 when the knob 102 is rotated a full revolution or at least when the cam 202 is rotated through the upward bend 210. Cam 202 and piezoelectric beam 208 can be used for example as an "On/Off" indicator, as a switch reset, or to indicate when the switch is in a particular position, e.g., communication channel one.

Figure 3:
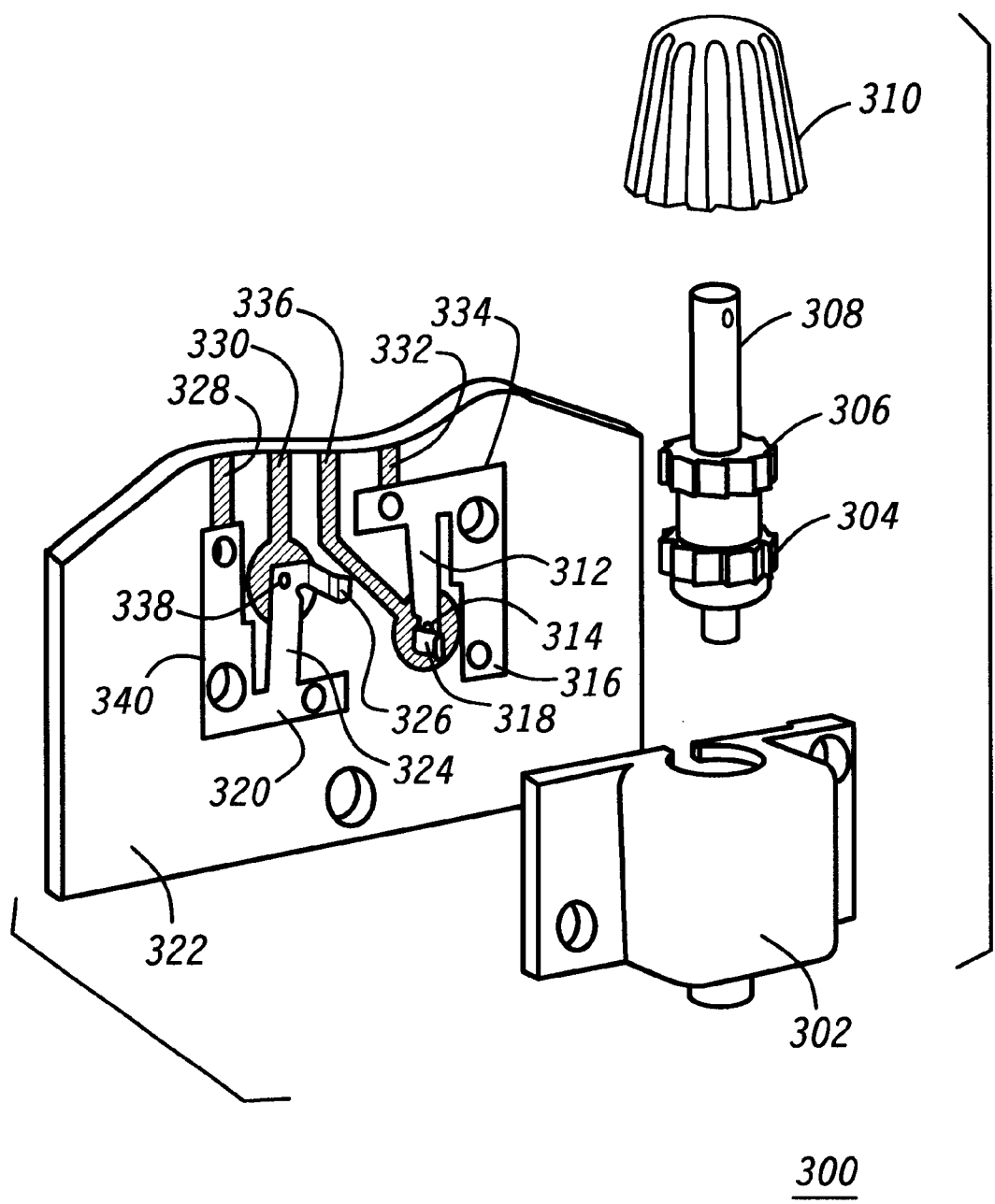
FIG. 3 shows an exploded view of a "piezoelectric active-mode incrementor switch system in accordance with a second alternative embodiment of the present invention.

A second alternative embodiment of the present invention is shown in FIG. 3 as switch 300. Switch system 300 comprises two ratchet wheels 304, 306 inversely (the teeth on the ratchet wheels face in opposite directions) but fixedly (ratchet wheels do not rotate about drive shaft 308) mounted on a drive shaft 308, two contact brackets 316 and 320, a switch housing 302, knob 310, and a PCB 322 having metallization (traces) 328, 330, 332 and 336. Note that in this embodiment, the cantilevered members do not need to have piezoelectric film since in its most basic design, switch 300 operates opening/closing electrical circuits formed by contact bracket 320 and conductive traces 328 and 330, and contact bracket 316 and electrical traces 336 and 332. Contact brackets 316 and 320 with the help of ratchet wheels 304 and 306 act as switches opening and closing their respective electrical circuits as will be explained in detail below.

The two identical contact brackets 316, 320 each include one actuation cantilever beam 312, 324 and one stationary base 334, 340. The stationary bases 334, 340 of the contact brackets are electrically coupled to traces 328, 332 which are connected to ground potential in the preferred embodiment. Although it can be appreciated by those of ordinary skill in the art that in a variation of the second embodiment, instead of having traces 328, 332 grounded, they can be energized with a certain voltage level depending on the particular design. Trace 332, bracket 316 and trace 336 form a first electrical circuit, while trace 328, bracket 320 and trace 330 form a second electrical circuit.

The actuation cantilever beams 312 and 324 are designed so that their upstanding portions 326 and 318 have turned end portions that rest on the teeth of the ratchet wheels 306 and 304. The bottom portions 314 and 338 of cantilever beams 312 and 324 contact metallization traces 336 and 330 respectively on the PCB 322, thus closing the switch circuitry signal path.

In operation the switch 300 functions by mechanically making and breaking either the first or second electrical circuits during the rotation of drive shaft 308, utilizing ratchet wheels 304, 306, contact brackets 320 and 334 and the metallization traces 328, 330, 336 and 332. When the knob 310 is turned clockwise, the first 306 and second 304 ratchet wheels are rotating in the same direction together. Since the ratchet wheels 306 and 304 are inversely mounted with respect to each other (teeth on ratchet wheels face in opposite directions) on the drive shaft 308, only the first wheel 304 is capable of lifting up its associated cantilever beam 312. The second ratchet wheel 306 can only deflect (bend) the second cantilever beam 324 without lifting it (opening or activating the electrical contact).

Thus, if the knob 310 is rotated from a first switch position to a second switch position, the tip of the upstanding portion 318 of cantilever beam 312 is lifted up or activated by the teeth of ratchet wheel 304, and then suddenly dropped down. This movement of the cantilever beam breaks or electrically opens momentarily the normally closed first switch circuitry. This momentarily opening of the first switch circuitry is monitored by the switch control circuit (not shown) and stored in memory. Further clockwise rotation of drive shaft 308 will further activation (in this case opening) of the electrical circuit. These switch activations can be associated with, for example, the switch being incremented.

Rotating the knob 310 in a counter clockwise direction, will cause the second ratchet wheel 306 to lift up and drop the second cantilever beam 324. The first cantilever beam 312 is only deflected by the teeth of the first ratchet wheel 304 preventing the bottom portion 314 from lifting up from its mating contact with trace 336. The mechanical movement of the second cantilever beam 324 breaks momentarily the normally closed second switch circuitry by lifting up bottom portion 338 from trace 330. The activation of switch 300 is monitored by the switch control circuit (not show) which can take the form of a microprocessor or other well-known control circuit. Since the channel selector in this design will not increment or decrement radio channels when the radio is turned off or the battery is removed, this switch should be used with a radio equipped with an electronic display to identify the current switch position.

Figure 5:
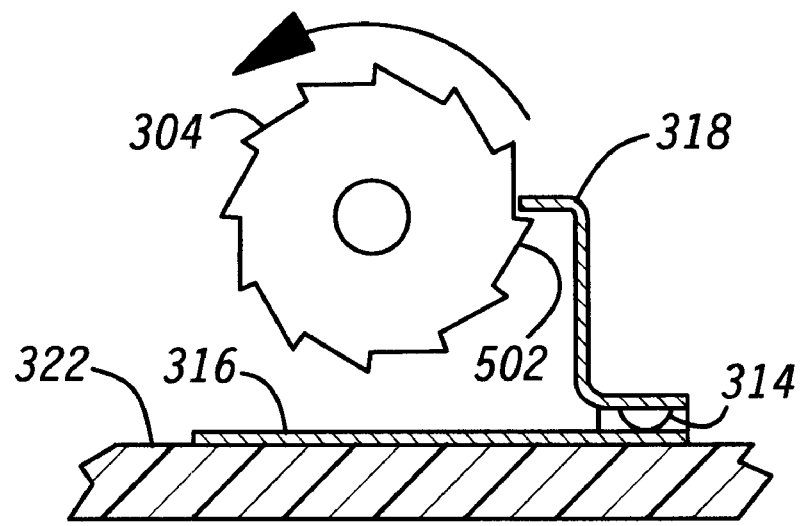
FIG. 5 shows a further illustration of a ratchet wheel on the piezoelectric activemode incrementor switch system of FIG. 3 activates the piezoelectric member.

In FIG. 5 there is shown a close up view from the bottom of ratchet wheel 304 mated with upstanding portion 318 of bracket 316. When ratchet wheel 304 is turned clockwise (which appears as counterclockwise in FIG. 5) it causes bottom portion 314 of the cantilevered beam to become activated and lift up as the tip of the upstanding portion 318 engages tooth 502 on ratchet wheel 304. The lifting up of bottom portion 314 causes it to stop making electrical contact with electrical trace 316 located on printed circuit board 322. As the knob 310 is rotated further, the tip of the upstanding portion clears tooth 502 and the circuit is closed. Each time bottom portion 314 is activated or lifted up it causes an open circuit in the electrical circuit which can be registered by the switch control circuit (not shown).

Figure 6:
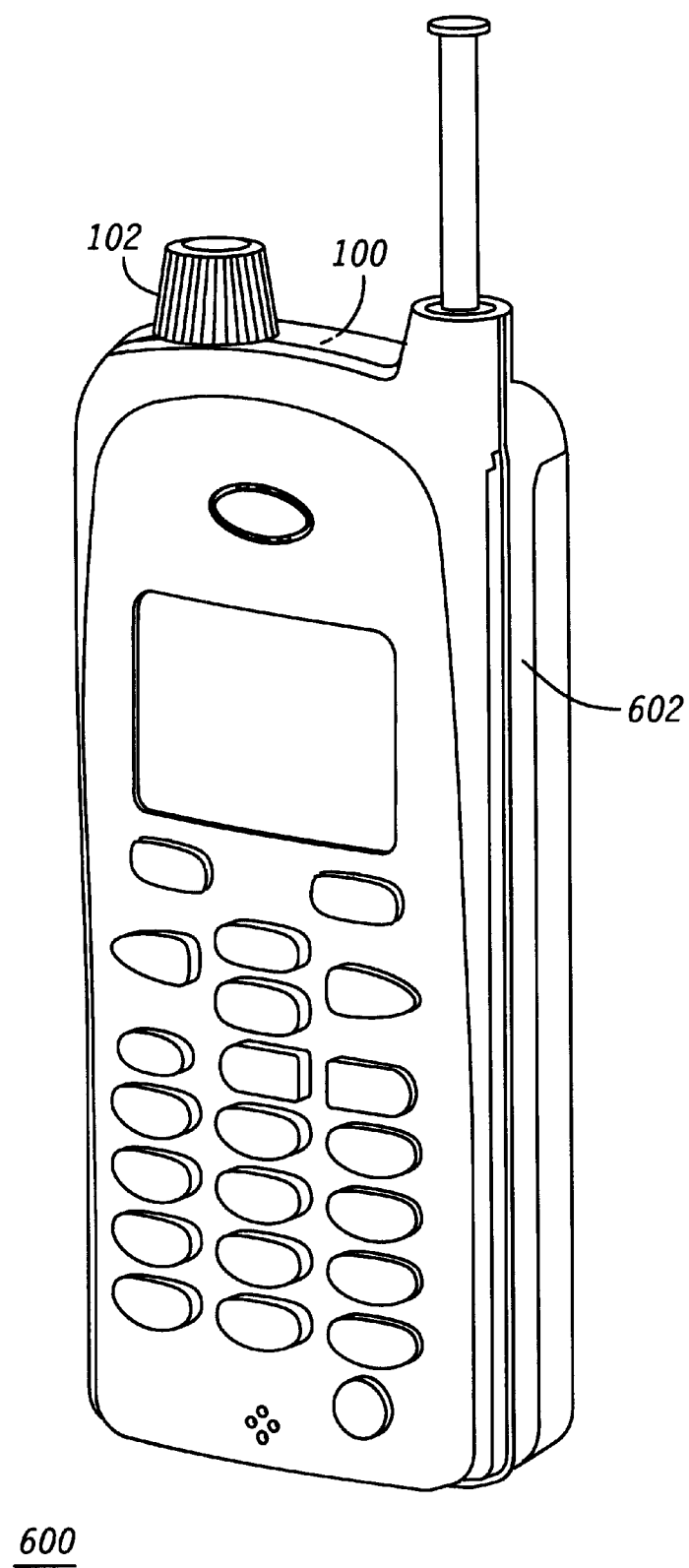
FIG. 6 shows a radio having a piezoelectric active-mode incrementor switch system in accordance with the present invention.

Referring now to FIG. 6 there is shown an electronic device such as a two-way radio 600 using piezoelectric active-mode incrementor switch system 100 located inside the radio housing 602. Knob 102 allows the radio user to rotate the switch's drive shaft as previously discussed above.

Figure 7:
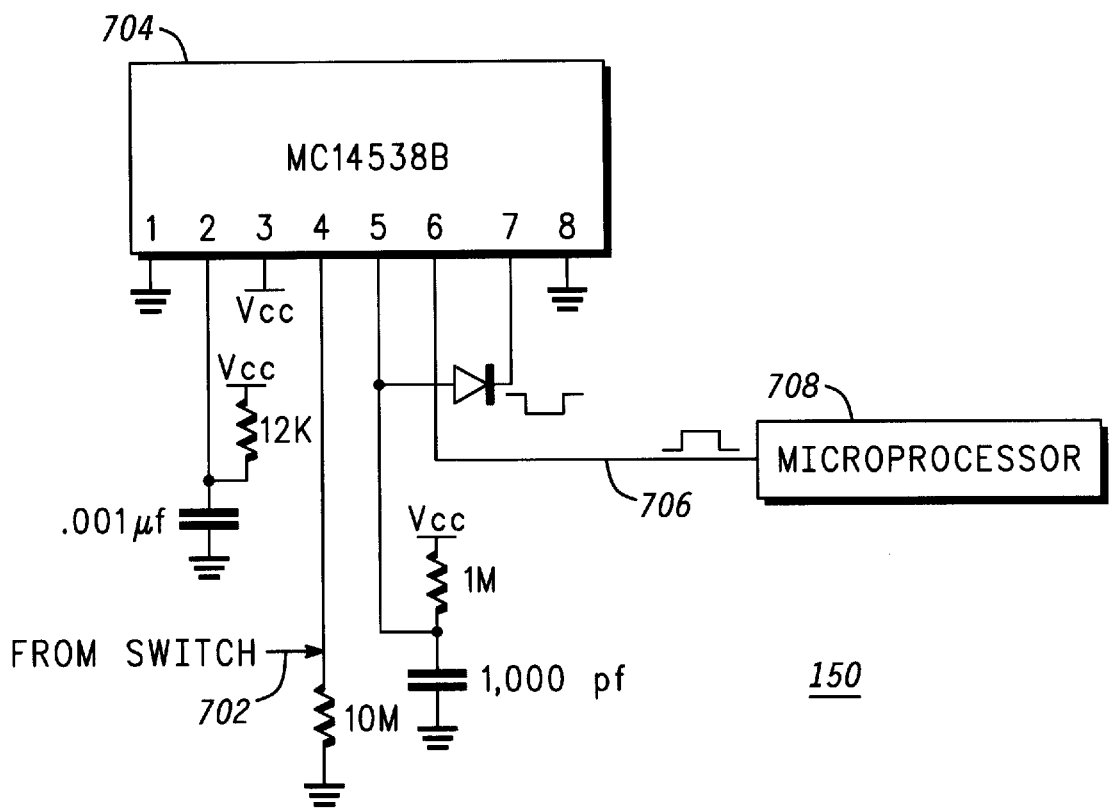
FIG. 7 shows a more detailed block diagram of the piezoelectric active-mode incrementor switch system control circuit in accordance with the present invention.

In FIG. 7 there is shown a more detailed block diagram of the switch control circuit 150 shown in FIG. 1. Switch control circuit 150 is used to decode the electrical signals 702 generated by one of the piezoelectric beams 110 or 138 when they are deflected. A retriggerable/resettable monostable multivibrator 704 (also known in the art as a "one shot") such a MC14538B manufactured by Motorola, Inc. of Schaumburg, Ill. is used to receive the electrical signal 702 generated from the piezo beam 110 or 138.

Figure 8:
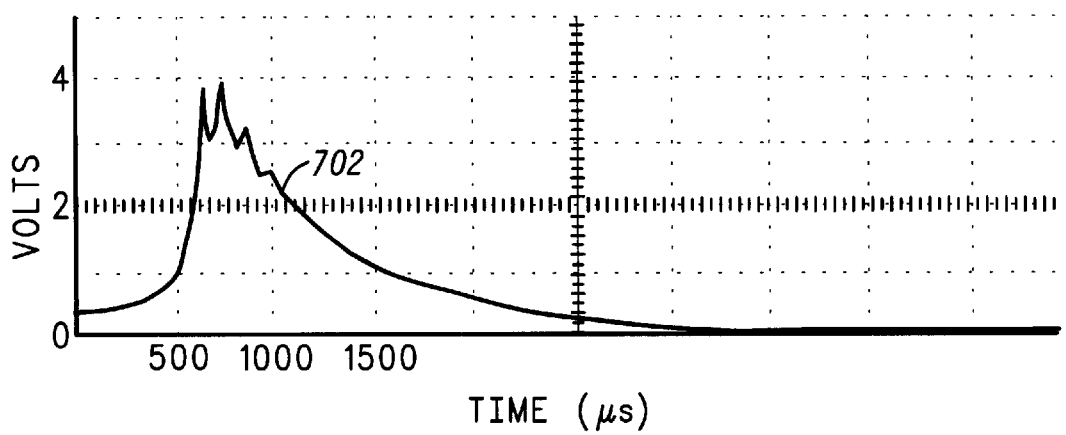
FIG. 8 shows a typical signal waveform generated by a piezo beam that is part of the piezoelectric active-mode incrementor switch system of FIGS. 1 and 2 in accordance with the preferred and alternative embodiments of the present invention.

A typical electrical signal generated from piezoelectric beam 110 or 138 is shown in FIG. 8. The one shot 704 takes signal 702 and produces an accurate output pulse 706. The circuit designer using external timing components can select the width of the output pulse 706. Once generated, the output pulse 706 is sent to a microprocessor or microcontroller 708 or other control circuit as is well known in the art. In the case of a two-way radio or other electronic device, the microprocessor 708 can be the radio or device's main controller, thereby avoiding having to use a separate component in the design. Preferably, the microprocessor or microcontroller 708 includes onboard nonvolatile memory in order to store the switch position information as previously discussed.

Some of the benefits of the switch assemblies of the present invention include that the piezoelectric active-mode incrementor switch system 100, 200 draw essentially no current, and there is a part reduction as compared to a typical electromechanical switch. The switches of the present invention also have increased reliability since they do not require the contact wiping action found in some electromechanical switches. The switch assemblies described can be used on a broad range of electrical devices which require a rotary switch.

Testing has shown that piezoelectric active-mode incrementor switch system 100 has been able to operate for about forty million operations (equating to about 3.33 million complete revolutions) without delamination of the piezoelectric film applied to piezoelectric beam assembly 106. These results compare very favorably to the twenty-five thousand-operation life of a typical electromechanical switch. Testing also showed that the piezoelectric active-mode incrementor switch system 100 could be operated several million times with a minimal number of switch operations missed.

While three embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A switch system, comprising:

a drive shaft;

first and second ratchet wheels inversely mounted on the drive shaft; and first and second cantilever beams mechanically coupled one each to the first and second ratchet wheels, wherein when the drive shaft is turned in a first direction, the first ratchet wheel causes the first cantilever beam but not the second cantilever beam to become activated and when the drive shaft is turned in a second direction, the second ratchet wheel causes the second cantilever beam but not the first cantilever beam to become activated.

2. A switch system, comprising:

a drive shaft;

first and second ratchet wheels inversely mounted on the drive shaft; and first and second cantilever beams mechanically coupled one each to the first and second ratchet wheels, wherein the first cantilever beam forms part of a first electrical circuit and the second cantilever beam forms part of a second electrical circuit, and when the first cantilever beam becomes activated, the state of the first electrical circuit is changed and when the second cantilever beam becomes activated the state of the second electrical circuit is changed, and further wherein when the drive shaft is rotated in a first direction, the first electrical circuit becomes activated but not the second electrical circuit, and when the drive shaft is rotated in a direction opposite the first direction, the second electrical circuit becomes activated but not the first electrical circuit.

3. A switch, comprising:

a drive shaft;

a first drive wheel fixedly mounted on the drive shaft;

a first ratchet wheel rotationally mounted on the drive shaft and cooperating with the first drive wheel to form a slip clutch mechanism; and a spring located on the drive shaft and proving a spring load to the first ratchet wheel.

4. A switch as defined in claim 3, wherein the first drive wheel has protrusions and the first ratchet wheel has cavities which mate with the protrusions.

5. A switch, comprising:

a drive shaft;

a first drive wheel fixedly mounted on the drive shaft;

a first ratchet wheel rotationally mounted on the drive shaft and cooperating with the first drive wheel to form a slip clutch mechanism; and a first cantilevered beam laminated with a piezoelectric film, wherein the first ratchet wheel deflects the first cantilevered beam to generate signals, and further wherein the first ratchet wheel has teeth facing in a first direction allowing the first ratchet wheel to deflect the cantilevered beam to generate the signals in one direction of rotation of the drive shaft, but the first ratchet wheel is disconnected from the drive wheel preventing signals from being generated when the drive shaft is rotated in a second direction.

6. A switch, comprising:

a drive shaft;

a first drive wheel fixedly mounted on the drive shaft;

a first ratchet wheel rotationally mounted on the drive shaft and cooperating with the first drive wheel to form a slip clutch mechanism;

a first cantilevered beam laminated with a piezoelectric film; and wherein the first ratchet wheel deflects the first cantilevered beam to generate signals;

a second drive wheel fixedly mounted to the drive shaft;

a second ratchet wheel rotationally mounted on the drive shaft and cooperating with the second drive wheel to form a slip clutch mechanism, wherein the second ratchet wheel is mounted inversely to the first ratchet wheel; and a second cantilevered beam laminated with a piezoelectric film, wherein second ratchet wheel deflects the second cantilevered beam to generate signals, wherein the first ratchet wheel has teeth facing in one direction and the second ratchet wheel has teeth facing in an opposite direction, and the first cantilevered beam is deflected by the first ratchet wheel when the drive shaft is rotated in a first direction but not in a second direction and the second cantilevered beam is deflected by the second ratchet wheel when the drive shaft is rotated in the second direction but not the first direction.

7. A switch as defined in claim 6, further comprising:

a switch knob having a cam attached to the drive shaft; and a third cantilevered beam laminated with a piezoelectric film and wherein the cam located on the switch knob deflects the third cantilevered beam to generate signals by the piezoelectric film.

8. An electronic device, comprising:

a housing; and a switch system mounted to the housing, the switch system comprising:

a drive shaft;

a first drive wheel fixedly mounted on the drive shaft; and a first ratchet wheel rotationally mounted on the drive shaft;

a spring located about the drive shaft and proving a spring load to the first ratchet wheel; and the first drive wheel has protrusions and the first ratchet wheel has cavities which mate with the protrusions to form a slip clutch mechanism.

9. An electronic device as defined in claim 8, further comprising:

a first cantilevered beam laminated with a piezoelectric film, wherein the first ratchet wheel deflects the first cantilevered beam to generate signals.

10. An electronic device as defined in claim 9, wherein the first ratchet wheel has teeth facing in a first direction allowing the first ratchet wheel to deflect the first cantilevered beam to generate the signals in one direction of rotation of the drive shaft, but the first ratchet wheel is disconnected from the drive wheel preventing signals from being generated when the drive shaft is rotated in a second direction.

11. An electronic device as defined in claim 10, further comprising:

a second drive wheel fixedly mounted to the drive shaft; and a second ratchet wheel rotationally mounted on the drive shaft and cooperating with the second drive wheel to form a slip clutch mechanism, wherein the second ratchet wheel is mounted inversely to the first ratchet wheel.

12. An electronic device as defined in claim 11, wherein the first ratchet wheel has teeth facing in one direction and the second ratchet wheel has teeth facing in an opposite direction, and the first cantilevered beam is deflected by the first ratchet wheel when the drive shaft is rotated in a first direction but not in a second direction.

* * * * *